(12) United States Patent
Chang et al.

(10) Patent No.: US 12,101,941 B2
(45) Date of Patent: Sep. 24, 2024

(54) FERROELECTRIC MEMORY STRUCTURE

(71) Applicant: Powerchip Semiconductor Manufacturing Corporation, Hsinchu (TW)

(72) Inventors: Shou-Zen Chang, Hsinchu (TW); Ming-Han Liao, Hsinchu (TW); Min-Cheng Chen, Hsinchu County (TW); Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 409 days.

(21) Appl. No.: 17/537,519

(22) Filed: Nov. 30, 2021

(65) Prior Publication Data
US 2023/0137738 A1    May 4, 2023

(30) Foreign Application Priority Data
Nov. 3, 2021    (TW) .................................. 110140923

(51) Int. Cl.
*H10B 53/20* (2023.01)
*G11C 5/10* (2006.01)
*G11C 11/22* (2006.01)

(52) U.S. Cl.
CPC ............... *H10B 53/20* (2023.02); *G11C 5/10* (2013.01); *G11C 11/221* (2013.01)

(58) Field of Classification Search
CPC ...................................................... H10B 53/20
See application file for complete search history.

(56) References Cited

U.S. PATENT DOCUMENTS

| | | |
|---|---|---|
| 5,892,706 A | 4/1999 | Shimizu et al. |
| 9,159,837 B2 | 10/2015 | Yamazaki et al. |
| 10,510,773 B2 | 12/2019 | Ramaswamy et al. |
| 2007/0236979 A1* | 10/2007 | Takashima ............. H10B 53/20 257/E21.664 |
| 2017/0154925 A1 | 6/2017 | Shimabukuro et al. |
| 2018/0182851 A1 | 6/2018 | Van Houdt |
| 2021/0175254 A1 | 6/2021 | Van Houdt |
| 2022/0231036 A1* | 7/2022 | Lee ..................... H01L 29/6684 |

FOREIGN PATENT DOCUMENTS

| | | |
|---|---|---|
| TW | 202036874 | 10/2020 |
| TW | 202118015 | 5/2021 |

OTHER PUBLICATIONS

"Office Action of Taiwan Counterpart Application", issued on Jun. 6, 2022, p. 1-p. 4.

* cited by examiner

*Primary Examiner* — Moazzam Hossain
(74) *Attorney, Agent, or Firm* — JCIPRNET

(57) ABSTRACT

A ferroelectric memory structure including a substrate, a ferroelectric capacitor structure, and a switch device is provided. The ferroelectric capacitor structure is disposed on the substrate. The ferroelectric capacitor structure includes at least one first electrode, first dielectric layers, a second electrode, and a ferroelectric material layer. The at least one first electrode and the first dielectric layers are alternately stacked. The second electrode penetrates through the first electrode. The ferroelectric material layer is disposed between the first electrode and the second electrode. The switch device is electrically connected to the ferroelectric capacitor structure.

20 Claims, 5 Drawing Sheets

FERROELECTRIC MEMORY STRUCTURE

CROSS-REFERENCE TO RELATED APPLICATION

This application claims the priority benefit of Taiwan application serial no. 110140923, filed on Nov. 3, 2021. The entirety of the above-mentioned patent application is hereby incorporated by reference herein and made a part of this specification.

BACKGROUND OF THE INVENTION

Field of the Invention

The invention relates to a memory structure, and particularly relates to a ferroelectric memory structure.

Description of Related Art

The ferroelectric memory is a non-volatile memory and has the advantage that the stored data will not disappear even after being powered off. In addition, compared with other non-volatile memory, the ferroelectric memory has the characteristics of high reliability and fast operation speed. However, how to make a single ferroelectric memory cell have multiple storage states without increasing the area of the ferroelectric memory cell is the goal of continuous efforts.

SUMMARY OF THE INVENTION

The invention provides a ferroelectric memory structure, which can make a single ferroelectric memory cell have multiple storage states without increasing the area of the ferroelectric memory cell.

The invention provides a ferroelectric memory structure, which includes a substrate, a ferroelectric capacitor structure, and a switch device. The ferroelectric capacitor structure is disposed on the substrate. The ferroelectric capacitor structure includes at least one first electrode, first dielectric layers, a second electrode, and a ferroelectric material layer. The at least one first electrode and the first dielectric layers are alternately stacked. The second electrode penetrates through the first electrode. The ferroelectric material layer is disposed between the first electrode and the second electrode. The switch device is electrically connected to the ferroelectric capacitor structure.

According to an embodiment of the invention, in the ferroelectric memory structure, the ferroelectric capacitor structure may be disposed between the switch device and the substrate.

According to an embodiment of the invention, in the ferroelectric memory structure, the switch device may be a transistor. The switch device may include a channel layer, a third electrode, a fourth electrode, a fifth electrode, and a second dielectric layer. The channel layer is disposed on the ferroelectric capacitor structure. The third electrode and the fourth electrode are disposed on the ferroelectric capacitor structure and located on two sides of the channel layer. The fifth electrode is disposed on the channel layer. The second dielectric layer is disposed between the fifth electrode and the channel layer.

According to an embodiment of the invention, in the ferroelectric memory structure, the channel layer of the switch device may be electrically connected to the second electrode of the ferroelectric capacitor structure.

According to an embodiment of the invention, in the ferroelectric memory structure, the third electrode of the switch device may be electrically connected to the second electrode of the ferroelectric capacitor structure.

According to an embodiment of the invention, in the ferroelectric memory structure, the material of the channel layer may be an oxide semiconductor.

According to an embodiment of the invention, in the ferroelectric memory structure, the oxide semiconductor may include indium gallium zinc oxide (IGZO), zinc oxide (ZnO), indium zinc oxide (IZO), cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$).

According to an embodiment of the invention, in the ferroelectric memory structure, the material of the third electrode and the material of the fourth electrode may be an N-type oxide semiconductor or a P-type oxide semiconductor.

According to an embodiment of the invention, in the ferroelectric memory structure, the N-type oxide semiconductor may include indium gallium zinc oxide (IGZO), zinc oxide (ZnO), or indium zinc oxide (IZO), and the N-type oxide semiconductor may have an N-type dopant.

According to an embodiment of the invention, in the ferroelectric memory structure, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$), and the P-type oxide semiconductor may have a P-type dopant.

According to an embodiment of the invention, in the ferroelectric memory structure, the switch device may be disposed between the ferroelectric capacitor structure and the substrate.

According to an embodiment of the invention, in the ferroelectric memory structure, the switch device may be a transistor. The switch device may include a third electrode, a second dielectric layer, a channel layer, a fourth electrode, and a fifth electrode. The third electrode is disposed on the substrate. The second dielectric layer is disposed on the third electrode and the substrate. The channel layer is disposed on the second dielectric layer and located above the third electrode. The fourth electrode and fifth electrode are disposed on the second dielectric layer and located on two sides of the channel layer.

According to an embodiment of the invention, in the ferroelectric memory structure, the channel layer of the switch device may be electrically connected to the second electrode of the ferroelectric capacitor structure.

According to an embodiment of the invention, in the ferroelectric memory structure, the fourth electrode of the switch device may be electrically connected to the second electrode of the ferroelectric capacitor structure.

According to an embodiment of the invention, in the ferroelectric memory structure, the fourth electrode and fifth electrode may partially cover the channel layer.

According to an embodiment of the invention, in the ferroelectric memory structure, the material of the channel layer may be an oxide semiconductor.

According to an embodiment of the invention, in the ferroelectric memory structure, the oxide semiconductor may include indium gallium zinc oxide (IGZO), zinc oxide (ZnO), indium zinc oxide (IZO), cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$).

According to an embodiment of the invention, in the ferroelectric memory structure, the material of the fourth electrode and the fifth electrode may be an N-type oxide semiconductor or a P-type oxide semiconductor.

According to an embodiment of the invention, in the ferroelectric memory structure, the N-type oxide semiconductor may include indium gallium zinc oxide (IGZO), zinc oxide (ZnO), or indium zinc oxide (IZO), and the N-type oxide semiconductor may have an N-type dopant.

According to an embodiment of the invention, in the ferroelectric memory structure, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$), and the P-type oxide semiconductor may have a P-type dopant.

Based on the above description, in the ferroelectric memory structure according to the invention, the ferroelectric capacitor structure includes at least one first electrode and the first dielectric layers alternately stacked, the second electrode penetrates through the first electrode, and the ferroelectric material layer is disposed between the first electrode and the second electrode. In addition, the first electrode can be used as a weighting state electrode. Therefore, when operating the ferroelectric memory structure, the impedance (e.g., capacitance) of the ferroelectric capacitor structure can be adjusted by applying voltage to the first electrode and the second electrode respectively. In this way, a single ferroelectric memory cell can have multiple storage states without increasing the area of the ferroelectric memory cell.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the present invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
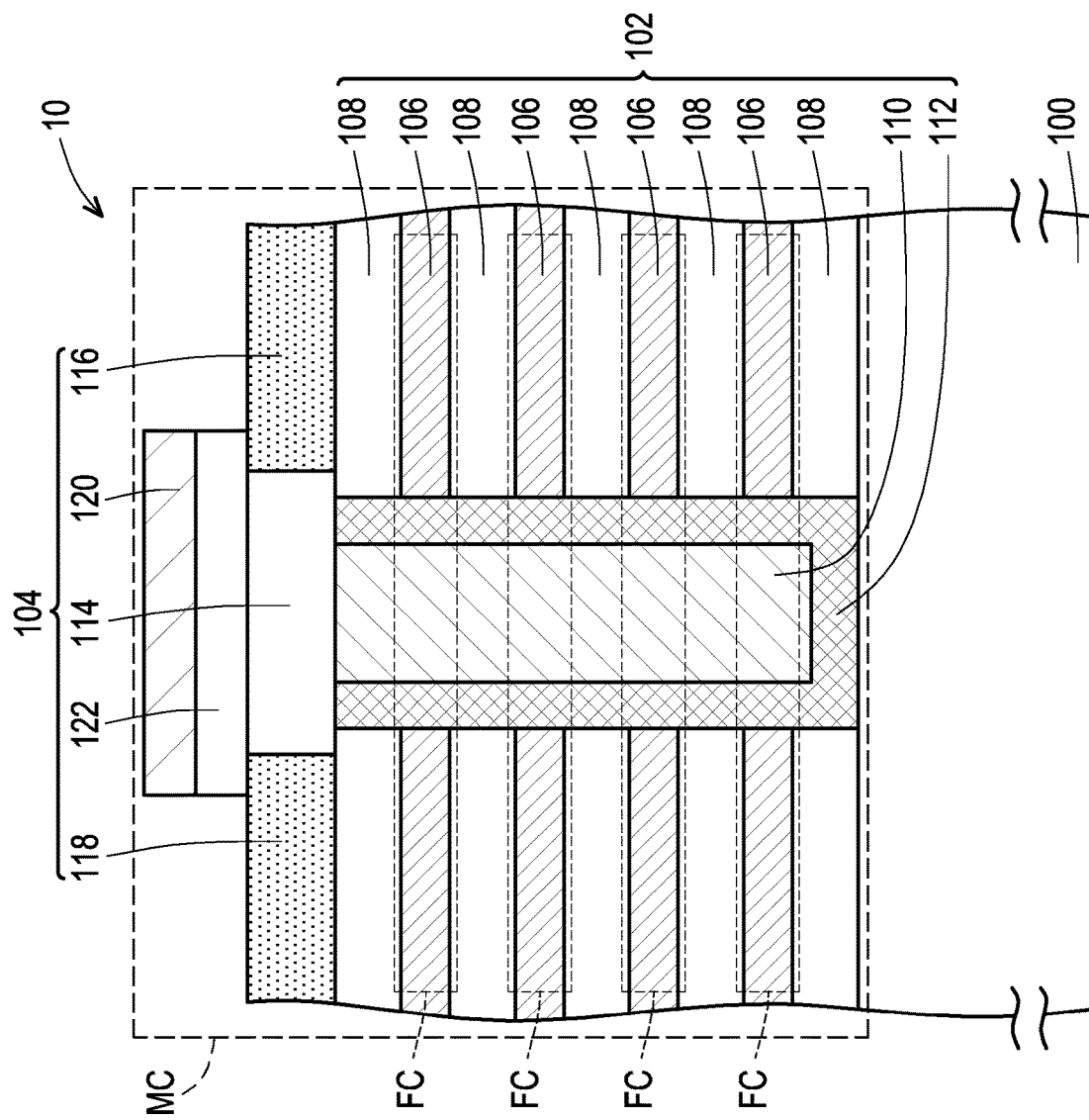
FIG. 1 is a cross-sectional view illustrating a ferroelectric memory structure according to some embodiments of the invention.
Figure 2:
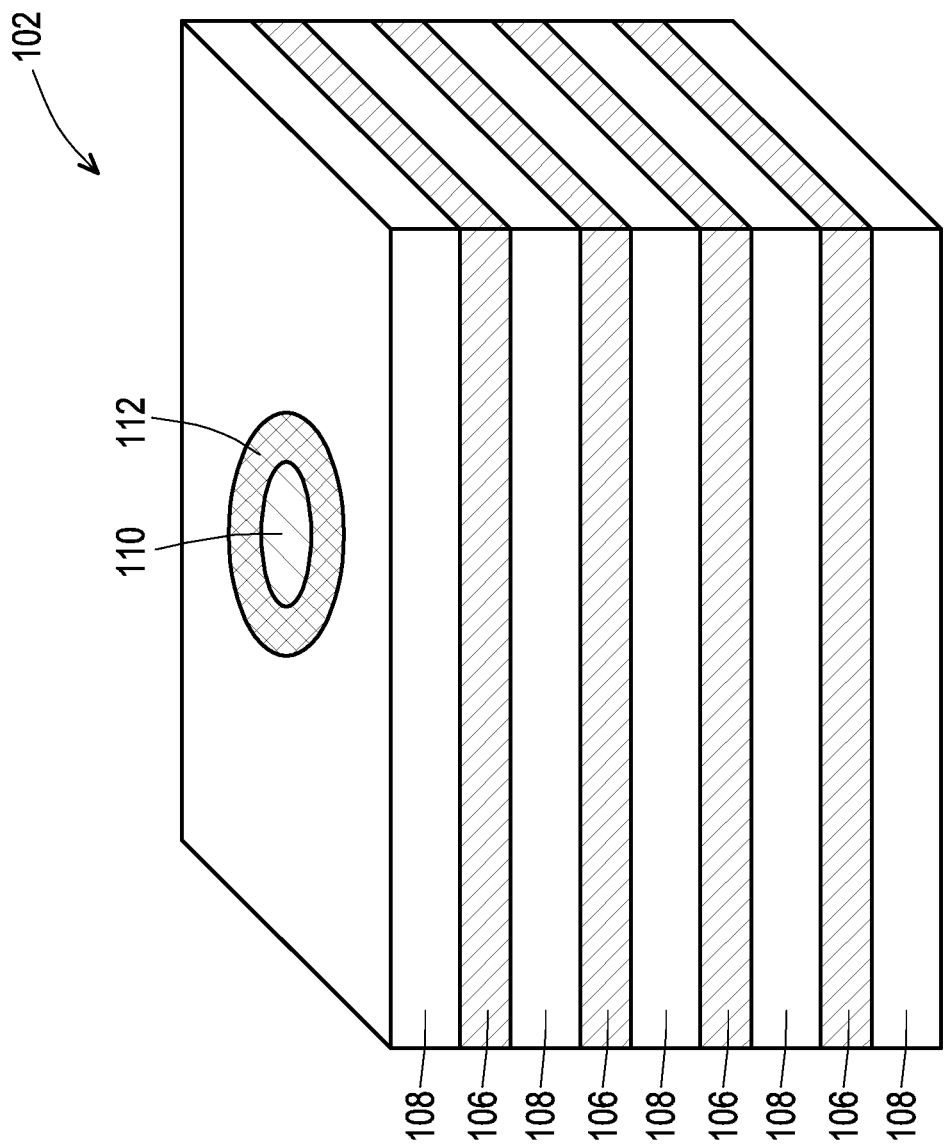
FIG. 2 is a schematic perspective view illustrating a ferroelectric capacitor structure in FIG. 1.
Figure 3:
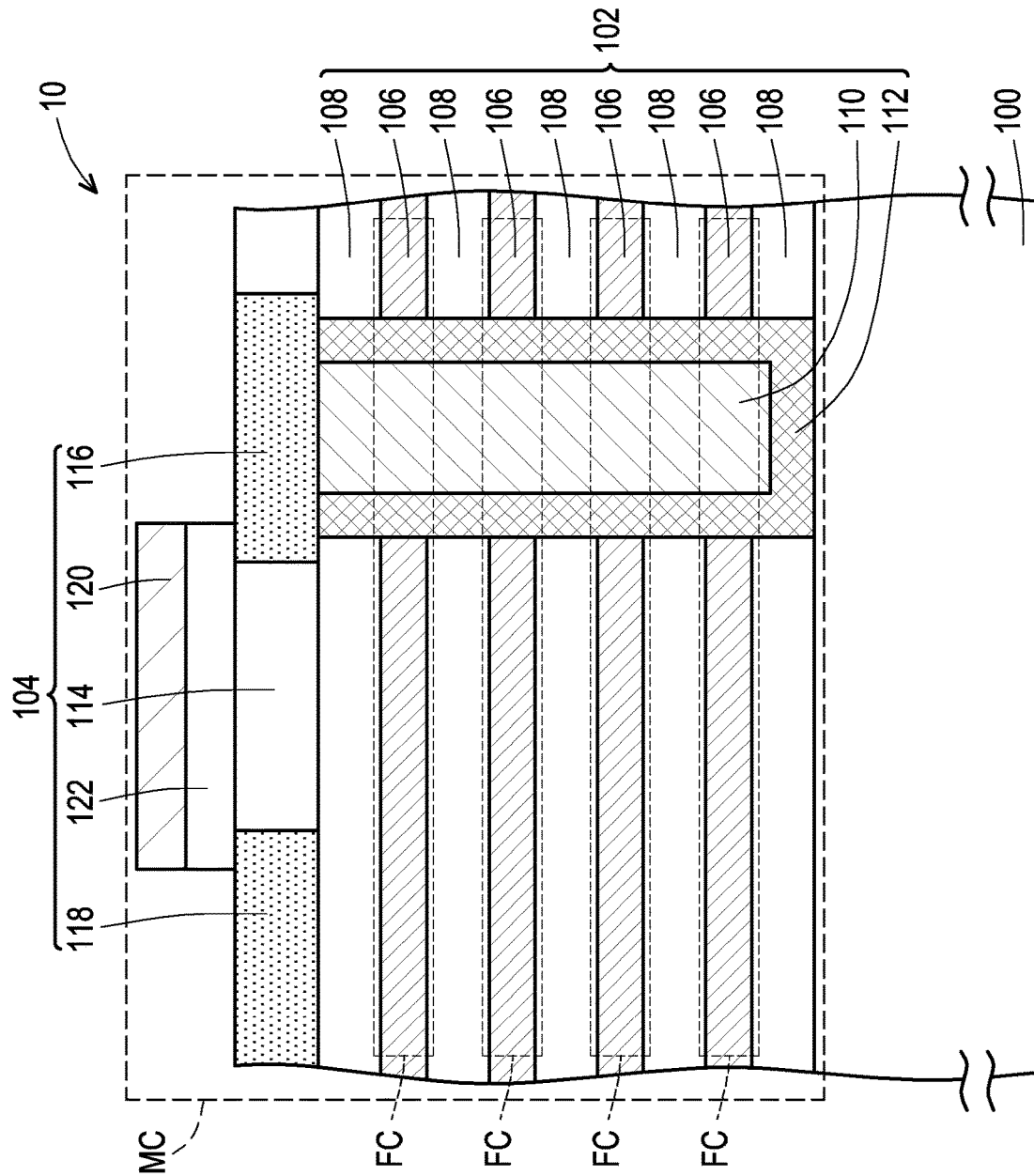
FIG. 3 is a cross-sectional view illustrating a ferroelectric memory structure according to other embodiments of the invention.

FIG. 1 is a cross-sectional view illustrating a ferroelectric memory structure according to some embodiments of the invention. FIG. 2 is a schematic perspective view illustrating a ferroelectric capacitor structure in FIG. 1. FIG. 3 is a cross-sectional view illustrating a ferroelectric memory structure according to other embodiments of the invention.

Referring to FIG. 1 and FIG. 2, a ferroelectric memory structure 10 includes a substrate 100, a ferroelectric capacitor structure 102, and a switch device 104. The substrate 100 may be a semiconductor substrate such as a silicon substrate. In the present embodiment, the ferroelectric capacitor structure 102 may be disposed between the switch device 104 and the substrate 100, but the invention is not limited thereto.

The ferroelectric capacitor structure 102 is disposed on the substrate 100. The ferroelectric capacitor structure 102 includes at least one electrode 106, dielectric layers 108, an electrode 110, and a ferroelectric material layer 112. At least one electrode 106 and the dielectric layers 108 are alternately stacked. The electrode 106 can be used as a weighting state electrode. The material of the electrode 106 is, for example, molybdenum, titanium, tantalum, tungsten, aluminum, copper, chromium, or an alloy thereof. The material of the dielectric layer 108 is, for example, a dielectric material such as silicon oxide, silicon nitride, or hafnium nitride. In the present embodiment, the number of electrodes 106 is, for example, multiple, but the number of electrodes 106 is not limited to the number shown in the figure. As long as the number of electrodes 106 is at least one, it falls within the scope of the invention.

The electrode 110 penetrates through the electrode 106. In addition, the electrode 110 may penetrate through at least a portion of the dielectric layers 108. The electrode 110 may be used as a bulk electrode. The material of the electrode 110 is, for example, molybdenum, titanium, tantalum, tungsten, aluminum, copper, chromium, or an alloy thereof.

The ferroelectric material layer 112 is disposed between the electrode 106 and the electrode 110. The material of the ferroelectric material layer 112 may include hafnium zirconium oxide ($HfZrO_x$, HZO), lead zirconate titanate (Pb$[Zr_xTi_{1-x}]O_3$, PZT), strontium titanium oxide ($SrTiO_3$, STO), barium titanate ($BaTiO_3$, BTO), or bismuth ferrite ($BiFeO_3$, BFO).

Furthermore, the ferroelectric capacitor structure 102 may include at least one ferroelectric capacitor FC, wherein each of the ferroelectric capacitors FC may include one electrode 106, the electrode 110, and the ferroelectric material layer 112. In the present embodiment, the ferroelectric capacitor structure 102 may include a plurality of ferroelectric capacitors FC electrically connected to each other, but the invention is not limited thereto. In some embodiments, the ferroelectric capacitors FC may share the electrode 110 and the ferroelectric material layer 112. Moreover, the number of ferroelectric capacitors FC is not limited to the number shown in the figure. As long as the number of ferroelectric capacitors FC is at least one, it falls within the scope of the invention.

The switch device 104 is electrically connected to the ferroelectric capacitor structure 102. In the present embodiment, the switch device 104 may be disposed on the ferroelectric capacitor structure 102. In the present embodiment, the switch device 104 may be a transistor, but the invention is not limited thereto. The switch device 104 may include a channel layer 114, an electrode 116, an electrode 118, an electrode 120, and a dielectric layer 122. The channel layer 114 is disposed on the ferroelectric capacitor structure 102. The material of the channel layer 114 may be an oxide semiconductor. In some embodiments, the oxide semiconductor may include indium gallium zinc oxide (IGZO), zinc oxide (ZnO), indium zinc oxide (IZO), cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$).

The electrode 116 and the electrode 118 are disposed on the ferroelectric capacitor structure 102 and located on two sides of the channel layer 114. The electrode 116 and the electrode 118 may be used as one and the other of the source and the drain, respectively. In the present embodiment, the electrode 116 may be used as a source, and the electrode 118 may be used as a drain. The material of electrode 116 and the material of electrode 118 may be an N-type oxide semiconductor or a P-type oxide semiconductor. In some embodiments, the N-type oxide semiconductor may include indium gallium zinc oxide (IGZO), zinc oxide (ZnO), or indium zinc oxide (IZO), and the N-type oxide semiconductor may have an N-type dopant. In some embodiments, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$), and the P-type oxide semiconductor may have a P-type dopant.

The electrode 120 is provided on the channel layer 114. The electrode 120 may be used as a gate. The material of the electrode 120 is, for example, molybdenum, titanium, tantalum, tungsten, aluminum, copper, chromium, or an alloy thereof.

The dielectric layer 122 is disposed between the electrode 120 and the channel layer 114. In some embodiments, the dielectric layer 122 may be further disposed between the electrode 120 and the electrode 116 and between the electrode 120 and the electrode 118. The dielectric layer 122 may be used as a gate dielectric layer. The material of the dielectric layer 122 is, for example, a dielectric material such as silicon oxide, silicon nitride, or hafnium nitride.

In the present embodiment, as shown in FIG. 1, the channel layer 114 of the switch device 104 may be electrically connected to the electrode 110 of the ferroelectric capacitor structure 102, so that the switch device 104 may be electrically connected to the ferroelectric capacitor structure 102, but the invention is not limited thereto. In other embodiments, as shown in FIG. 3, the electrode 116 of the switch device 104 may be electrically connected to the electrode 110 of the ferroelectric capacitor structure 102, so that the switch device 104 may be electrically connected to the ferroelectric capacitor structure 102.

In addition, the ferroelectric memory structure 10 may further include other required dielectric layers (for isolation) and/or other required interconnect structures (for electrical connection), and the description thereof is omitted here.

Hereinafter, Table 1 is used to illustrate various storage states of the ferroelectric memory cell MC of the ferroelectric memory structure 10. The ferroelectric memory cell MC of the ferroelectric memory structure 10 may include the ferroelectric capacitor structure 102 and the switch device 104 electrically connected to each other. By controlling the voltages applied to the electrode 106 and the electrode 110, the ferroelectric capacitor FC may have a polarization state of "positive (+) direction" or a polarization state of "negative (−) direction". When the ferroelectric capacitor FC has the polarization state of "positive (+) direction", the ferroelectric capacitor FC may have a low impedance (e.g., low capacitance $C_L$). When the ferroelectric capacitor FC has the polarization state of "negative (−) direction", the ferroelectric capacitor FC may have a high impedance (e.g., high capacitance $C_H$). Therefore, the impedance (e.g., capacitance) of each of the ferroelectric capacitors FC can be adjusted by the voltages applied to the electrode 106 and the electrode 110. In this way, when operating the ferroelectric memory cell MC, the electrode 106 can be used as a weighting state electrode, and the impedance (e.g., capacitance) of the ferroelectric capacitor structure 102 can be adjusted by applying voltage to the electrode 106 and the electrode 110 respectively, so that a single ferroelectric memory cell MC can have multiple storage states. In the present embodiment, the impedance is, for example, a capacitance, but the invention is not limited thereto.

For example, the ferroelectric capacitor structure 102 may include n electrodes 106, and "n" may be an integer greater than or equal to 1. As shown in Table 1, in the case where the ferroelectric capacitor structure 102 includes n electrodes 106 (e.g., weighting state electrodes WE1~WEn in Table 1), the ferroelectric capacitor structure 102 may include n ferroelectric capacitors FC electrically connected to each other. Therefore, the ferroelectric memory cell MC of the ferroelectric memory structure 10 may have n+1 storage states (i.e., "storage states 0~n" in Table 1).

TABLE 1

| weighting state electrode | WE1 | WE2 | WE3 | ... WEn |
|---|---|---|---|---|
| storage state 0: $nC_L$ | $C_L$ | $C_L$ | $C_L$ | ... $C_L$ |
| storage state 1: $1C_H + (n-1)C_L$ | $C_H$ | $C_L$ | $C_L$ | ... $C_L$ |
| storage state 2: $2C_H + (n-2)C_L$ | $C_H$ | $C_H$ | $C_L$ | ... $C_L$ |
| storage state 3: $3C_H + (n-3)C_L$ | $C_H$ | $C_H$ | $C_H$ | ... $C_L$ |
| . | . | . | . | . |
| . | . | . | . | . |
| . | . | . | . | . |
| storage state n: $nC_H$ | $C_H$ | $C_H$ | $C_H$ | ... $C_H$ |

Based on the above embodiment, in the ferroelectric memory structure 10, the ferroelectric capacitor structure 102 includes at least one electrode 106 and the dielectric layers 108 alternately stacked, the electrode 110 penetrates through the electrode 106, and the ferroelectric material layer 112 is disposed between the electrode 106 and the electrode 110. In addition, the electrode 106 can be used as a weighting state electrode. Therefore, when operating the ferroelectric memory structure 10, the impedance (e.g., capacitance) of the ferroelectric capacitor structure 102 can be adjusted by applying voltage to the electrode 106 and the electrode 110 respectively. In this way, a single ferroelectric memory cell MC can have multiple storage states without increasing the area of the ferroelectric memory cell MC.

Figure 4:
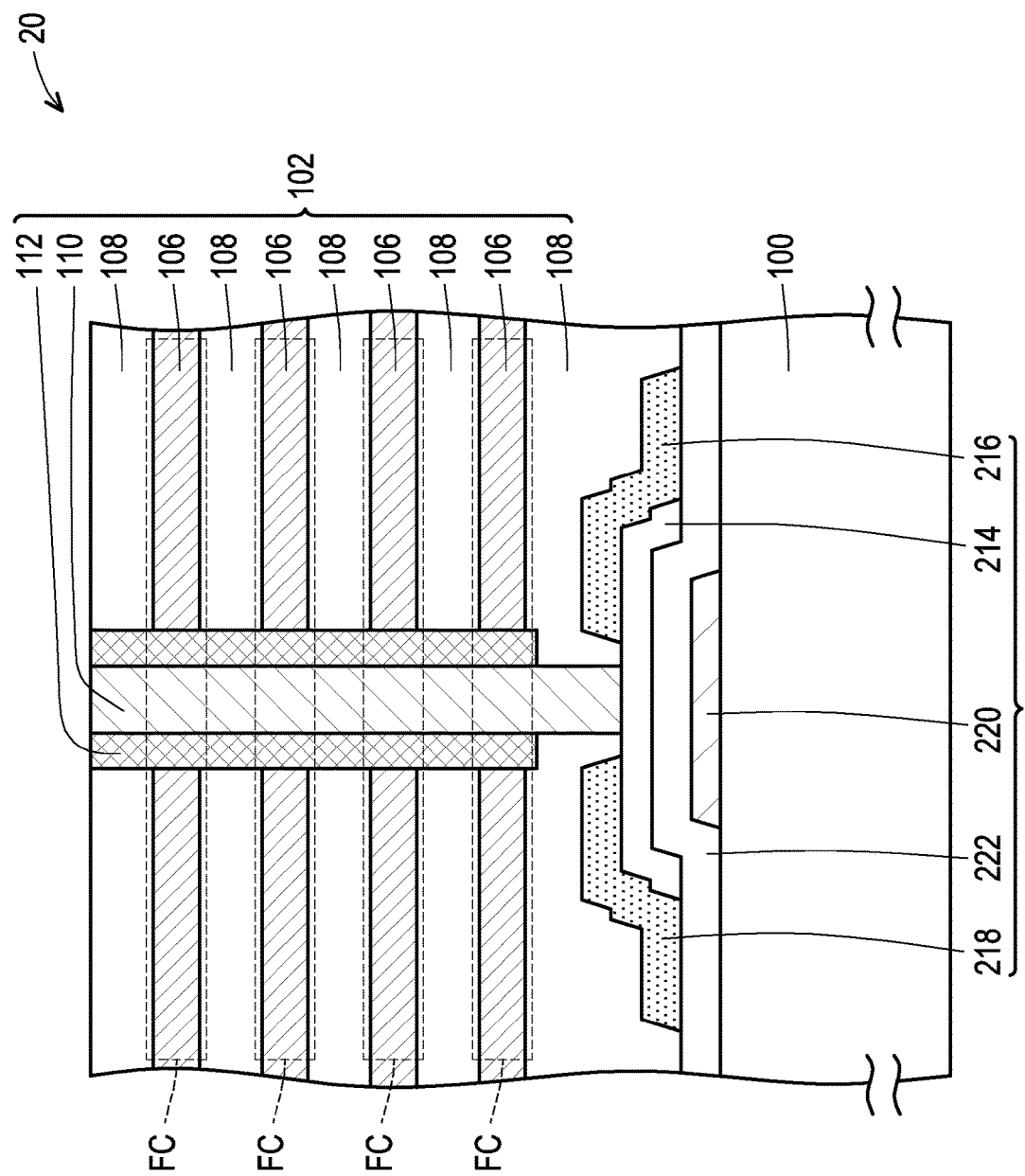
FIG. 4 is a cross-sectional view illustrating a ferroelectric memory structure according to other embodiments of the invention.
Figure 5:
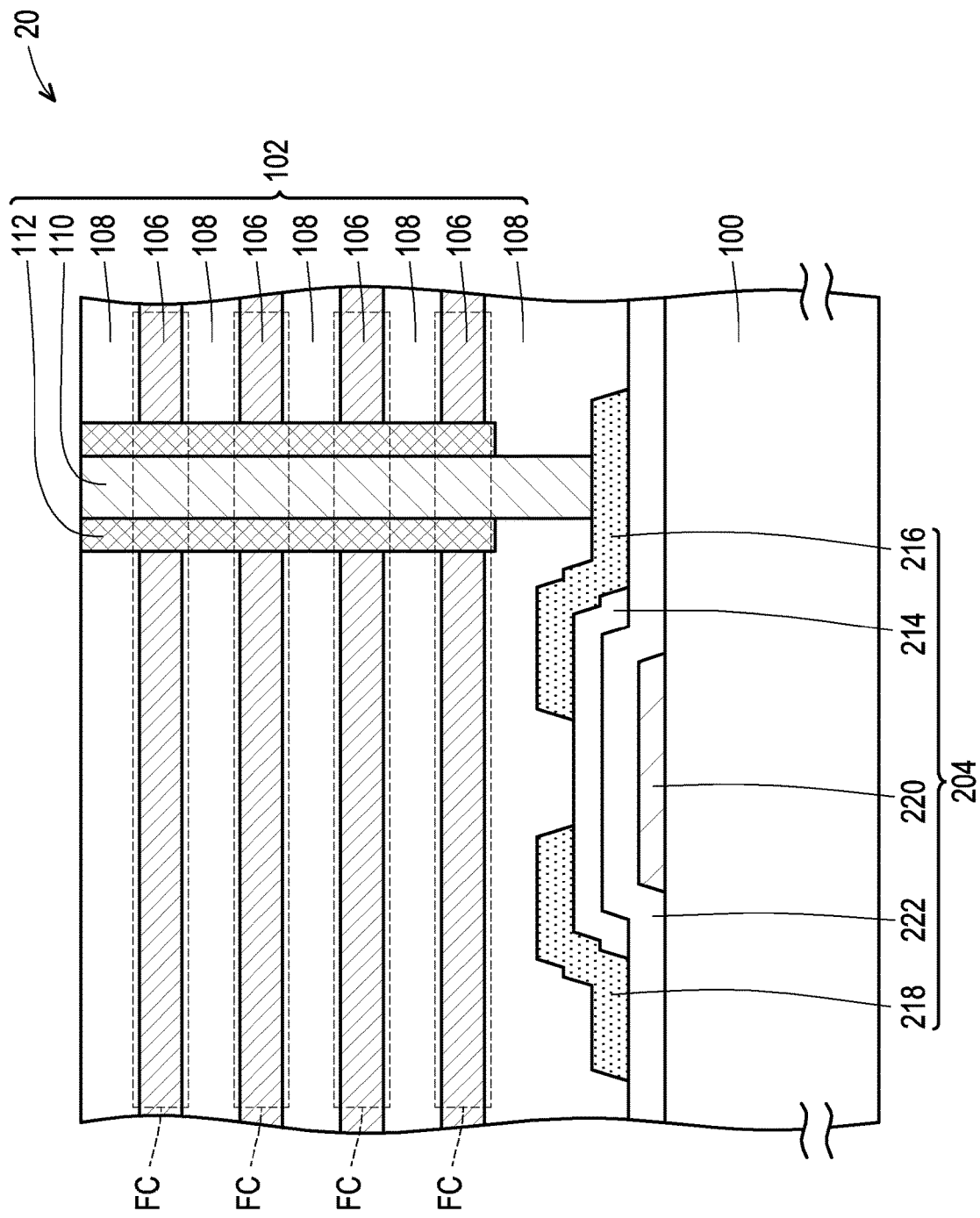
FIG. 5 is a cross-sectional view illustrating a ferroelectric memory structure according to other embodiments of the invention.

FIG. 4 is a cross-sectional view illustrating a ferroelectric memory structure according to other embodiments of the invention. FIG. 5 is a cross-sectional view illustrating a ferroelectric memory structure according to other embodiments of the invention.

Referring to FIG. 1 and FIG. 4, the difference between the ferroelectric memory structure 20 of FIG. 4 and the ferroelectric memory structure 10 of FIG. 1 is as follows. In the ferroelectric memory structure 20 of FIG. 4, the switch device 204 may be disposed between the ferroelectric capacitor structure 102 and the substrate 100. In the present embodiment, the switch device 204 may be disposed on the substrate 100, and the ferroelectric capacitor structure 102 may be disposed on the switch device 204.

The switch device 204 is electrically connected to the ferroelectric capacitor structure 102. In the present embodiment, the switch device 204 may be a transistor. The switch device 204 may include an electrode 220, a dielectric layer 222, a channel layer 214, an electrode 216, and an electrode 218. The electrode 220 is disposed on the substrate 100. The electrode 220 may be used as a gate. The material of the electrode 220 is, for example, molybdenum, titanium, tantalum, tungsten, aluminum, copper, chromium, or an alloy thereof.

The dielectric layer 222 is disposed on the electrode 220 and the substrate 100. The dielectric layer 222 may be used as a gate dielectric layer. The material of the dielectric layer 222 is, for example, a dielectric material such as silicon oxide, silicon nitride, or hafnium nitride.

The channel layer 214 is disposed on the dielectric layer 222 and located above the electrode 220. The material of the channel layer 214 may be an oxide semiconductor. In some embodiments, the oxide semiconductor may include indium gallium zinc oxide (IGZO), zinc oxide (ZnO), indium zinc oxide (IZO), cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$).

The electrode 216 and the electrode 218 are disposed on the dielectric layer 222 and located on two sides of the channel layer 214. In some embodiments, the electrode 216 and the electrode 218 may partially cover the channel layer 214. The electrode 216 and the electrode 218 may be used as one and the other of the source and the drain, respectively. In the present embodiment, the electrode 216 may be used as a source, and the electrode 218 may be used as a drain. The material of electrode 216 and the material of electrode 218 may be an N-type oxide semiconductor or a P-type oxide semiconductor. In some embodiments, the N-type oxide semiconductor may include indium gallium zinc oxide (IGZO), zinc oxide (ZnO), or indium zinc oxide (IZO), and the N-type oxide semiconductor may have an N-type dopant. In some embodiments, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$), and the P-type oxide semiconductor may have a P-type dopant.

In the present embodiment, as shown in FIG. 4, the channel layer 214 of the switch device 204 may be electrically connected to the electrode 110 of the ferroelectric capacitor structure 102, so that the switch device 204 may be electrically connected to the ferroelectric capacitor structure 102, but the invention is not limited thereto. For example, as shown in FIG. 4, the electrode 110 may penetrate through the electrode 106 and the dielectric layer 108 to be electrically connected to the channel layer 214. In other embodiments, as shown in FIG. 5, the electrode 216 of the switch device 204 may be electrically connected to the electrode 110 of the ferroelectric capacitor structure 102, so that the switch device 204 may be electrically connected to the ferroelectric capacitor structure 102. For example, as shown in FIG. 5, the electrode 110 may penetrate through the electrode 106 and the dielectric layer 108 to be electrically connected to the electrode 216.

In addition, the same or similar components in the ferroelectric memory structure 20 and the ferroelectric memory structure 10 are represented by the same or similar symbols, and the same or similar content (e.g., operation method) in the ferroelectric memory structure 20 and the ferroelectric memory structure 10 can be referred to the description of the ferroelectric memory structure 10 in the above-mentioned embodiment, which will not be described here. Furthermore, the ferroelectric memory structure 20 may further include other required dielectric layers (for isolation) and/or other required interconnect structures (for electrical connection), and the description thereof is omitted here.

Based on the above embodiment, in the ferroelectric memory structure 20, the ferroelectric capacitor structure 102 includes at least one electrode 106 and the dielectric layers 108 alternately stacked, the electrode 110 penetrates through the electrode 106, and the ferroelectric material layer 112 is disposed between the electrode 106 and the electrode 110. In addition, the electrode 106 can be used as a weighting state electrode. Therefore, when operating the ferroelectric memory structure 20, the impedance (e.g., capacitance) of the ferroelectric capacitor structure 102 can be adjusted by applying voltage to the electrode 106 and the electrode 110 respectively. In this way, a single ferroelectric memory cell MC can have multiple storage states without increasing the area of the ferroelectric memory cell MC.

In summary, in the ferroelectric memory structure of the aforementioned embodiments, the ferroelectric capacitor structure includes at least one weighting state electrode and the dielectric layers alternately stacked, and the weighting state electrode can be used to adjust the impedance (e.g., capacitance) of the ferroelectric capacitor structure. Therefore, a single ferroelectric memory cell can have multiple storage states without increasing the area of the ferroelectric memory cell.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A ferroelectric memory structure, comprising:
   a substrate;
   a ferroelectric capacitor structure disposed on the substrate and comprising:
   at least one first electrode and first dielectric layers alternately stacked;
   a second electrode penetrating through the first electrode; and
   a ferroelectric material layer disposed between the first electrode and the second electrode; and
   a switch device electrically connected to the ferroelectric capacitor structure, wherein
   the second electrode is in direct contact with the ferroelectric material layer.

2. The ferroelectric memory structure according to claim 1, wherein the ferroelectric capacitor structure is disposed between the switch device and the substrate.

3. The ferroelectric memory structure according to claim 2, wherein the switch device is a transistor and comprises:
   a channel layer disposed on the ferroelectric capacitor structure;
   a third electrode and a fourth electrode disposed on the ferroelectric capacitor structure and located on two sides of the channel layer;
   a fifth electrode disposed on the channel layer; and
   a second dielectric layer disposed between the fifth electrode and the channel layer.

4. The ferroelectric memory structure according to claim 3, wherein the channel layer of the switch device is electrically connected to the second electrode of the ferroelectric capacitor structure.

5. The ferroelectric memory structure according to claim 3, wherein the third electrode of the switch device is electrically connected to the second electrode of the ferroelectric capacitor structure.

6. The ferroelectric memory structure according to claim 3, wherein a material of the channel layer comprises an oxide semiconductor.

7. The ferroelectric memory structure according to claim 6, wherein the oxide semiconductor comprises indium gallium zinc oxide, zinc oxide, indium zinc oxide, cobalt oxide, nickel oxide, strontium copper oxide, copper aluminum oxide, copper indium oxide, or copper gallium oxide.

8. The ferroelectric memory structure according to claim 3, wherein a material of the third electrode and a material of the fourth electrode comprise an N-type oxide semiconductor or a P-type oxide semiconductor.

9. The ferroelectric memory structure according to claim 8, wherein the N-type oxide semiconductor comprises indium gallium zinc oxide, zinc oxide, or indium zinc oxide, and the N-type oxide semiconductor has an N-type dopant.

10. The ferroelectric memory structure according to claim 8, wherein the P-type oxide semiconductor comprises cobalt oxide, nickel oxide, strontium copper oxide, copper aluminum oxide, copper indium oxide, or copper gallium oxide, and the P-type oxide semiconductor has a P-type dopant.

11. The ferroelectric memory structure according to claim 1, wherein the switch device is disposed between the ferroelectric capacitor structure and the substrate.

12. The ferroelectric memory structure according to claim 11, wherein the switch device is a transistor and comprises:
a third electrode disposed on the substrate;
a second dielectric layer disposed on the third electrode and the substrate;
a channel layer disposed on the second dielectric layer and located above the third electrode; and
a fourth electrode and a fifth electrode disposed on the second dielectric layer and located on two sides of the channel layer.

13. The ferroelectric memory structure according to claim 12, wherein the channel layer of the switch device is electrically connected to the second electrode of the ferroelectric capacitor structure.

14. The ferroelectric memory structure according to claim 12, wherein the fourth electrode of the switch device is electrically connected to the second electrode of the ferroelectric capacitor structure.

15. The ferroelectric memory structure according to claim 12, wherein the fourth electrode and the fifth electrode partially cover the channel layer.

16. The ferroelectric memory structure according to claim 12, wherein a material of the channel layer comprises an oxide semiconductor.

17. The ferroelectric memory structure according to claim 16, the oxide semiconductor comprises indium gallium zinc oxide, zinc oxide, indium zinc oxide, cobalt oxide, nickel oxide, strontium copper oxide, copper aluminum oxide, copper indium oxide, or copper gallium oxide.

18. The ferroelectric memory structure according to claim 12, wherein a material of the fourth electrode and a material of the fifth electrode comprise an N-type oxide semiconductor or a P-type oxide semiconductor.

19. The ferroelectric memory structure according to claim 18, wherein the N-type oxide semiconductor comprises indium gallium zinc oxide, zinc oxide, or indium zinc oxide, and the N-type oxide semiconductor has an N-type dopant.

20. The ferroelectric memory structure according to claim 18, wherein the P-type oxide semiconductor comprises cobalt oxide, nickel oxide, strontium copper oxide, copper aluminum oxide, copper indium oxide, or copper gallium oxide, and the P-type oxide semiconductor has a P-type dopant.

* * * * *